(12) United States Patent
Thyagarajan et al.

(10) Patent No.: US 12,164,855 B2
(45) Date of Patent: Dec. 10, 2024

(54) METAL ROUTING TECHNIQUES

(71) Applicant: Arm Limited, Cambridge (GB)

(72) Inventors: Sriram Thyagarajan, Austin, TX (US); Yew Keong Chong, Austin, TX (US); Sony, Noida (IN); Andy Wangkun Chen, Austin, TX (US)

(73) Assignee: Arm Limited, Cambridge (GB)

( * ) Notice: Subject to any disclaimer, the term of this patent is extended or adjusted under 35 U.S.C. 154(b) by 551 days.

(21) Appl. No.: 17/209,903

(22) Filed: Mar. 23, 2021

(65) Prior Publication Data

US 2022/0309225 A1 Sep. 29, 2022

(51) Int. Cl.
*G06F 30/3953* (2020.01)
(52) U.S. Cl.
CPC .................. *G06F 30/3953* (2020.01)
(58) Field of Classification Search
CPC ..................................... G06F 30/3953

USPC .......................................... 716/130
See application file for complete search history.

(56) References Cited

U.S. PATENT DOCUMENTS

2012/0119782 A1\* 5/2012 Madurawe ........ H01L 27/11807
326/47

\* cited by examiner

*Primary Examiner* — Eric D Lee
(74) *Attorney, Agent, or Firm* — Pramudji Law Group PLLC; Ari Pramudji

(57) ABSTRACT

Various implementations described herein are directed to a method for identifying pre-routed metal lines in a higher layer of a multi-layered structure. The method may recognize gaps in the pre-routed metal lines of the higher layer, and also, the method may automatically fill the gaps with conductive stubs to modify the pre-routed metal lines in the higher layer as a continuous metal line with an extended length.

20 Claims, 7 Drawing Sheets

500

510 — identify pre-routed metal lines in layers of a multi-layered structure

520 — recognize a first pre-routed metal line in a first layer of the layers

530 — recognize a second pre-routed metal line in a second layer of the layers

530 — automatically couple the first pre-routed metal line to the second pre-routed metal line with conductive vias that extend between the first layer and the second layer

610 — identify metal lines in multiple layers of a multi-layered structure

620 — recognize a shorter metal line in a lower layer of the multiple layers

630 — recognize a longer metal line in a higher layer of the multiple layers

630 — recognize gaps in the longer metal lines of the higher layer

630 — automatically fill the gaps with conductive stubs to modify the longer metal lines in the higher layer as a continuous metal line with an extended length

630 — automatically couple the shorter metal line to the longer pre-routed metal line with conductive vias that extend between the lower layer and the higher layer

FIG. 6

METAL ROUTING TECHNIQUES

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, lower-level metal layers may show degradation as compared to higher metal layers. Due to scaling in advanced process nodes, the metal layer resistance may substantially degrade with extended use. The routing of critical signals in the lower-level metals may cause significant performance degradation because of the high-wire resistance. In some cases, the performance metal routing is critical for low-level memories when compared to larger memories, such as, e.g., cache memories. For instance, it may be more critical to speed-up timing of low-level memories due to continuous increases in clock computing frequencies. In some cases, faster timing of clock computing frequencies in low-level memories would boost overall computing performance. As such, there exists a need to overcome deficiencies in conventional circuit designs by improving the performance of metal routing that may be considered critical for some low-level memory applications.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

FIGS. 4-6 illustrate various process flow diagrams of methods for providing metal routing architecture in accordance with implementations described herein.

DETAILED DESCRIPTION

Figure 1A:
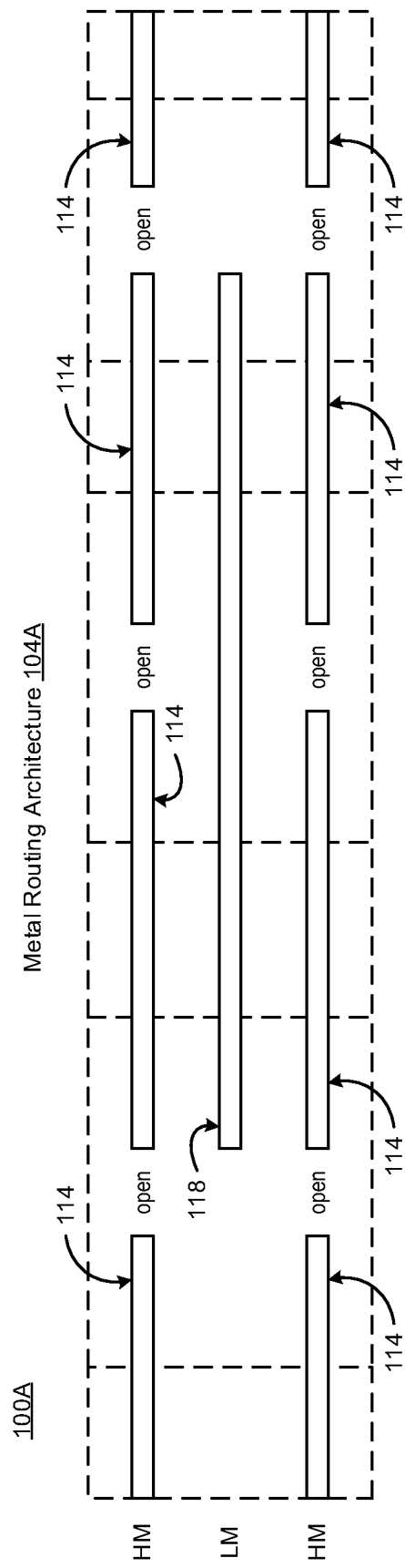
FIGS. 1A-1B illustrate diagrams of metal routing architecture in accordance with various implementations described herein.

Various implementations described herein are directed to metal routing fabrication schemes and techniques for various circuit applications in physical design. For instance, the various schemes and techniques described herein may provide for flexible top-metal usage schemes and techniques that improve performance. Also, various metal routing fabrication schemes and techniques described herein provide for a novel metal routing architecture in physical layout design of circuit layout structures by using top-metal layers to reduce wire-resistance and/or reduce wire-capacitance so as to thereby improve performance.

In some implementations, higher-metal stacks may be reserved for routing global signals that fly over each sub-bank in a multi-bank memory design. The higher-metal stacks may be programed to perform different functions based on different memory configurations, and the critical signals within a given memory bank may be pre-routed in lower level metal, wherein alternating metal layers are disposed perpendicular to each other in a vertical stack configuration. For instance, even metal layers (e.g., M0, M2, M4, etc.) may be disposed with a horizontal orientation, and also, poly layer along with odd metal layers (e.g., M1, M3, M5, etc.) may be disposed with a vertical orientation. In some flexible-bank configurations, the top-metal layers (e.g., M3, M4) may be programmed to send the buffered input/output signals from the macro memory left-edge to each individual bank, where they are used to accomplish local buffering so as to control individual banks. In some cases, the critical signals within the individual banks that remain in lower metal layers (e.g., M1, M2) may be pre-routed, and the same top-metal layers (e.g., M3, M4) that are reserved for signal-routing may be unused as the inputs are in the middle itself and no buffering is needed.

Some schemes and techniques described herein may be used to program tracks to strap the lower-level metals for critical signal nets (e.g., M4 may be strapped to M2, and M3 may be strapped to M1). These straps may be strategically programmed, and also, the remaining top-metal that is unused is left unprogrammed and floating to reduce capacitance on the critical signal nets. In this instance, the critical signal's resistance may be significantly reduced so as to improve performance. In reference to some memory instances, such as for larger multi-bank memory instances (e.g., flexible bank: FB=4), stub programming may be applied and used to provide longer routes over larger distances to farther banks. In reference to other memory instances, such as for smaller 2-bank memory instances (e.g., flexible bank: FB=2), via programming may be applied and used to strap and improve resistance. By using via-pillars at the source and the destination, the effective via-resistance for some inter-layer vias may be reduced, and also, combination of stub and via-programming may be used to make these top-metal layers flexible in some flexible bank (FB) designs.

Various implementations of providing metal routing architecture will be described herein with reference to FIGS. 1-7.

Figure 1B:
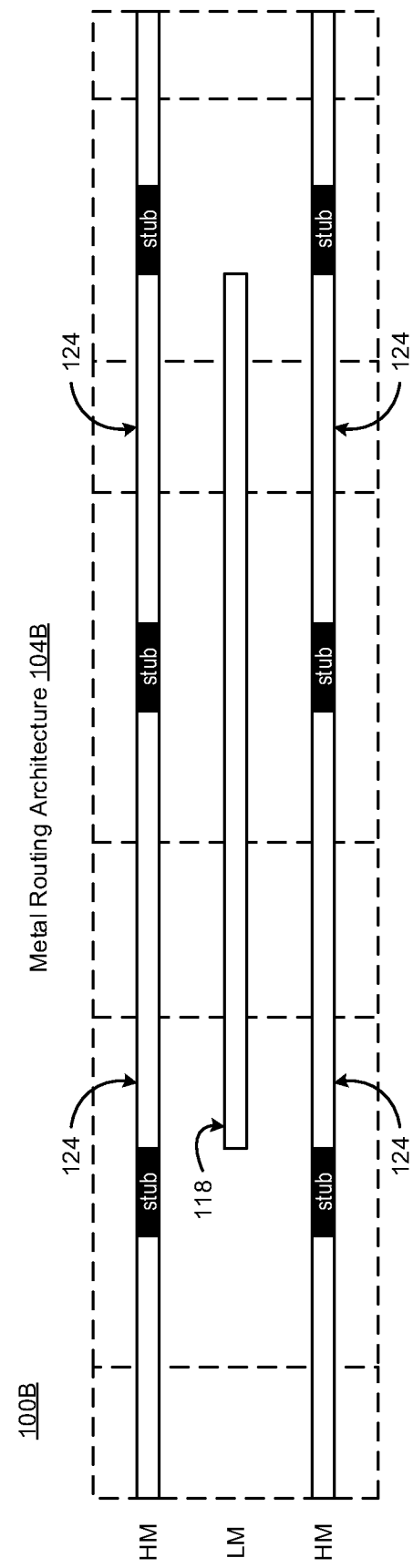

FIGS. 1A-1B illustrate diagrams of metal routing architecture in accordance with various implementations described herein. In particular, FIG. 1A illustrates a diagram 100A of metal routing architecture 104A, and FIG. 1B illustrates a diagram 100B of metal routing architecture 104B. The metal routing architectures 104A, 104B provide for flexible top-metal (or high metal) usage schemes and techniques for improving performance. For instance, as shown in FIGS. 1A-1B, the various metal routing schemes and techniques described herein may be used to extend higher metal lines to improve performance.

In various implementations, the metal routing architecture 104A, 104B shown in FIGS. 1A, 1B may be implemented as a system or a device having various integrated circuit (IC) components that are arranged and coupled together as an assemblage or combination of parts that provide for physical circuit designs and related structures. In some instances, a method of designing, providing and/or fabricating the metal routing architecture 104A, 104B in FIGS. 1A, 1B as an integrated system or device may involve use of the various IC circuit components described herein so as to thereby implement various circuit fabrication schemes and techniques associated therewith. Moreover, the metal routing architecture 104A, 104B may be integrated with computing circuitry and related components on a single chip, and the metal routing architecture 104A, 104B may be implemented and incorporated in embedded systems for automotive, electronic, mobile, server and IoT applications.

As shown in FIG. 1A, the metal routing architecture 104A may include multiple layers (LM, HM) that are arranged and vertically stacked in a multi-layered structure. In some implementations, the multiple layers (LM, HM) may include a lower layer (LM) and a higher layer (HM), wherein the lower layer (LM) may be referred to as a bottom layer, and wherein the higher layer (HM) may be referred to as a top layer. The metal routing architecture 104A may include pre-routed metal lines 114 formed in the higher layer (HM) of the multi-layered structure, and also, the metal routing architecture 104A may include pre-routed metal lines 118 formed in the lower layer (LM) of the multi-layered structure. Also, in various instances, the metal routing architecture 104A may include gaps (open) in the pre-routed metal lines 114 of the higher layer (HM). Moreover, in some instances, as shown in FIG. 1B, the gaps (open) may be filled with conductive stubs (stub) so as to thereby modify the pre-routed metal lines 114 in the higher layer (HM) as a continuous metal line 124 having an extended length that is longer than the pre-routed metal lines 118 in the lower layer (LM).

In some implementations, in reference to FIG. 1B, the metal routing architecture 104B may be manufactured, or caused to be manufactured, as integrated circuitry along with the pre-routed metal lines 114 with the stubs (stub) in the higher layer (HM) as the continuous metal line 124 with the extended length. Also, in this instances, the metal routing architecture 104B may be manufactured, or caused to be manufactured, as the integrated circuitry along with the pre-routed metal lines 118 in the lower layer (LM). The multi-layered structure may also include the multiple layers (LM, HM) including the higher layer (HM) and a lower layer (LM) that is disposed beneath the higher layer (HM). Moreover, the multiple layers (LM, HM) may also be arranged in a stack configuration with the higher layer (HM) disposed above the lower layer (LM). The pre-routed metal lines 118 in the lower layer (LM) may have a length that is less than a length of the pre-routed metal lines 114 of the higher layer (HM).

In various implementations, as shown in FIGS. 1A-1B, the gaps (open) may be automatically filled with conductive stubs (stub), which may refer to extending the pre-routed metal lines 114 in the higher layer (HM) as the continuous metal line 124 with the extended length such that the length of the pre-routed metal lines 114 of the higher layer (HM) is greater than the length of the pre-routed metal lines 118 in the lower layer (LM). In some instances, as shown in FIG. 1A, the gaps (open) in the pre-routed metal lines 118 of the higher layer (HM) may refer to spatial openings that are formed between portions of the pre-routed metal lines 118 of the higher layer (HM). Further, as shown in FIG. 1B, the stubs (stub) may refer to conductive branches that bridge the spatial openings that are formed between the portions of the pre-routed metal lines 118 of the higher layer (HM). Moreover, the continuous metal lines 124 formed by modifying the pre-routed metal lines 114 in the higher layer (HM) may be used to achieve longer lengths of conductive metal lines 124 for improved transmission of critical signals between circuit components in a power grid network.

Figure 2A:
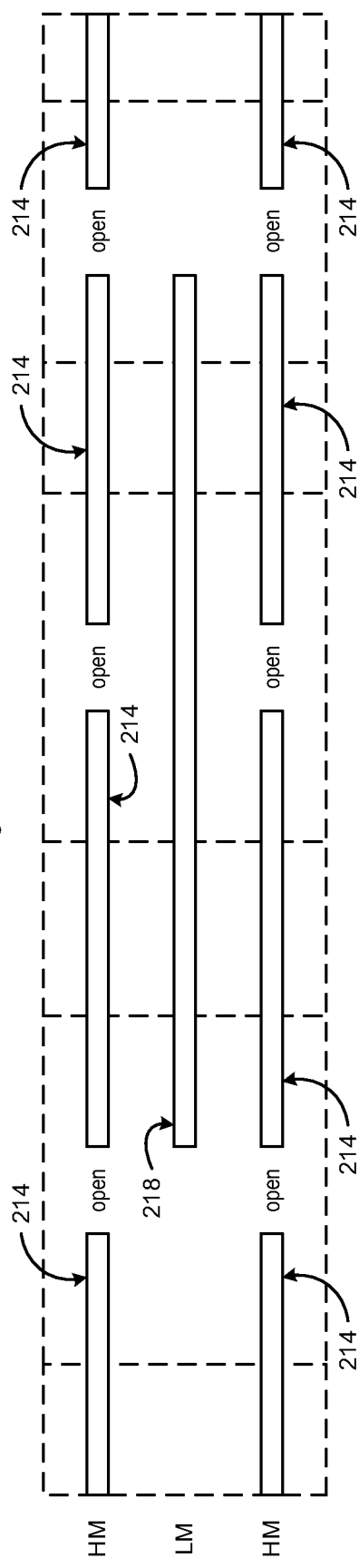
FIGS. 2A-2B illustrate diagrams of metal routing architecture in accordance with various implementations described herein.
Figure 2B:
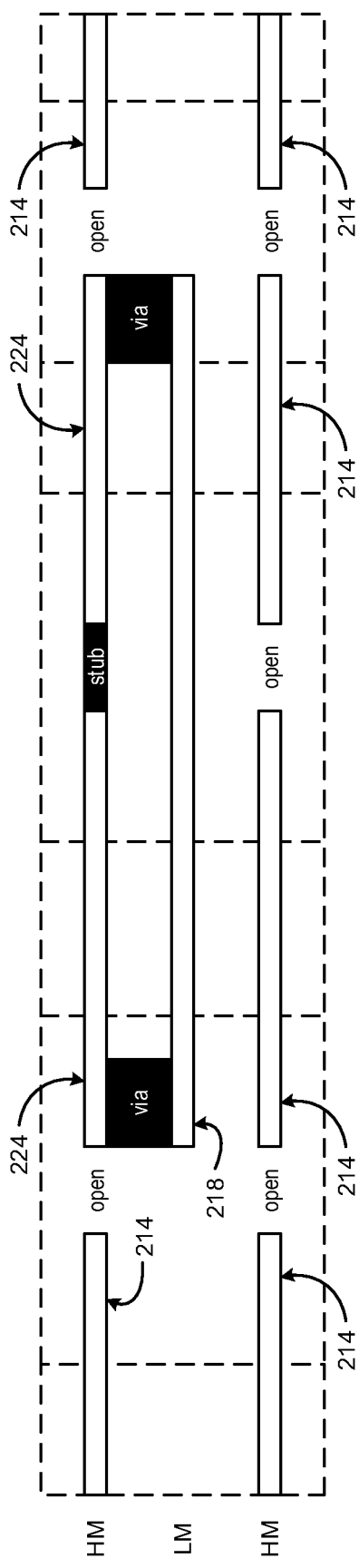

FIGS. 2A-2B illustrate diagrams of metal routing architecture in accordance with various implementations described herein. In particular, FIG. 2A illustrates a diagram 200A of metal routing architecture 204A, and FIG. 2B illustrates a diagram 200B of metal routing architecture 204B. The metal routing architectures 204A, 204B provide for flexible top-metal (or high metal) usage schemes and techniques for improving performance. For instance, as shown in FIGS. 2A-2B, the various metal routing schemes and techniques described herein may be used to couple lower metal lines to higher metal lines to improve performance.

In various implementations, the metal routing architecture 204A, 204B shown in FIGS. 2A, 2B may be implemented as a system or a device having various integrated circuit (IC) components that are arranged and coupled together as an assemblage or combination of parts that provide for physical circuit designs and related structures. In some instances, a method of designing, providing and/or fabricating the metal routing architecture 204A, 204B in FIGS. 2A, 2B as an integrated system or device may involve use of the various IC circuit components described herein so as to thereby implement various circuit fabrication schemes and techniques associated therewith. Moreover, the metal routing architecture 204A, 204B may be integrated with computing circuitry and related components on a single chip, and the metal routing architecture 204A, 204B may be implemented and incorporated in embedded systems for automotive, electronic, mobile, server and IoT applications.

As shown in FIG. 2A, the metal routing architecture 204A may include multiple layers (LM, HM) that are arranged and vertically stacked in a multi-layered structure. In some implementations, the multiple layers (LM, HM) may include a lower layer (LM) and a higher layer (HM), wherein the lower layer (LM) may be referred to as a bottom layer, and wherein the higher layer (HM) may be referred to as a top layer. The metal routing architecture 204A may include pre-routed metal lines 214 formed in the higher layer (HM) of the multi-layered structure, and also, the metal routing architecture 204A may include pre-routed metal lines 218 formed in the lower layer (LM) of the multi-layered structure. Also, in various instances, the metal routing architecture 204A may include gaps (open) in the pre-routed metal lines 214 of the higher layer (HM). Also, in some instances, as shown in FIG. 2B, one or more gaps (open) may be filled with conductive stubs (stub) so as to thereby modify the pre-routed metal lines 214 in the higher layer (HM) as a continuous metal line 224 having an extended length that is longer than the pre-routed metal lines 218 in the lower layer (LM).

In some implementations, in reference to FIG. 1A, the metal routing architecture 104A may include the pre-routed metal lines 214, 218 in the multiple layers (LM, HM) of the multi-layered structure. Also, the multiple layers (LM, HM) may include one or more first pre-routed metal lines 218 in a lower layer (LM) as a first layer of the layers, and also, the multiple layers (LM, HM) may include one or more second pre-routed metal lines 214 in a higher layer (HM) as a second layer of the layers. Also, as shown in FIG. 2B, the first pre-routed metal line 218 may be coupled to one or more second pre-routed metal lines 214 with conductive vias (via) that extend between the first layer (LM) and the second layer (HM).

In some implementations, in reference to FIG. 1B, the metal routing architecture 104B may be manufactured, or caused to be manufactured, as integrated circuitry with the first pre-routed metal line 218 coupled to the one or more second pre-routed metal lines 214 with the conductive vias (via) that extend between the first layer and the second layer. Also, the metal routing architecture 104B may include gaps (open) in the second pre-routed metal line 214 of the second layer (HM), and in some instances, the gaps (open) may be filled with conductive stubs (stub) so as to modify the second pre-routed metal lines 214 in the second layer (HM) as a continuous metal line 224 with an extended length. The first layer (LM) may refer to a lower metal layer (LM) that is disposed underneath the second layer (HM), and the second layer (HM) may refer to a higher metal layer (HM) that is different than the first layer (LM), and also, the layers (LM, HM) may be arranged in a stack configuration with the higher metal layer (HM) disposed above the lower metal layer (LM).

In some implementations, in reference to FIGS. 1A-1B, the first pre-routed metal line 218 may be formed in the lower layer (LM), and the first pre-routed metal line 218 may have a length that is less than a length of the second pre-routed metal line 214 of the higher layer (HM). Also, as shown in reference to FIG. 2B, one or more gaps (open) may be filled with conductive stubs (stub) that are used extend the second pre-routed metal line 214 in the higher layer (HM) as the continuous metal line 224 with the extended length such that the length of the extended pre-routed metal lines 224 of the higher layer (HM) is greater than the length of the pre-routed metal lines 218 in the lower layer (LM). Also, the gaps (open) formed in the second pre-routed metal lines 214 of the higher layer (HM) may be associated with spatial openings that are formed between portions of the second pre-routed metal lines 214 of the higher layer (HM). Also, the stubs (stub) may refer to conductive branches that bridge the spatial openings that are formed between the portions of the second pre-routed metal lines 214 of the higher layer (HM).

Figure 3A:
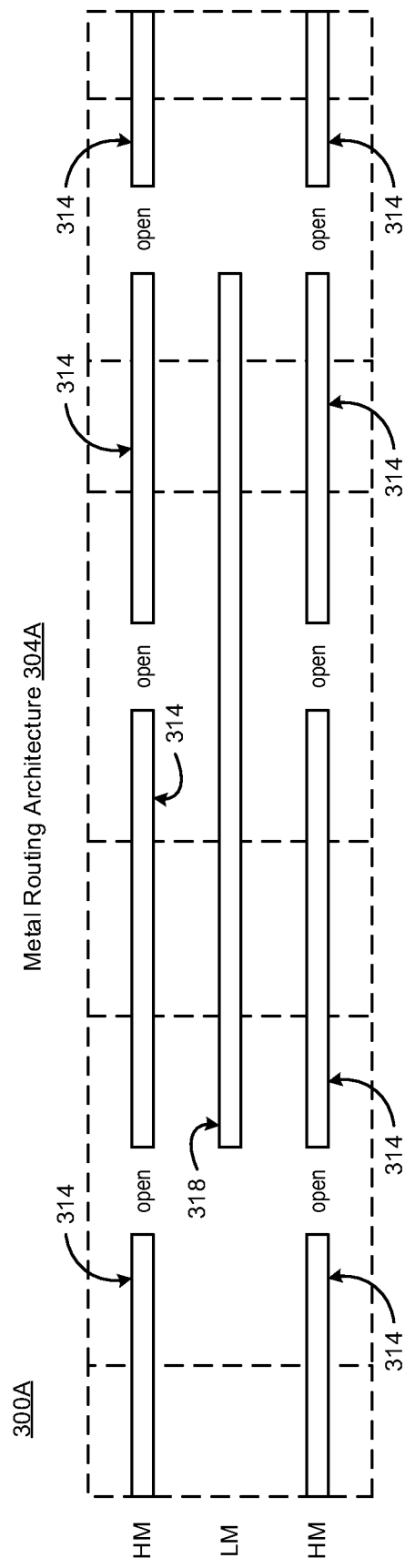
FIGS. 3A-3B illustrate diagrams of metal routing architecture in accordance with various implementations described herein.
Figure 3B:
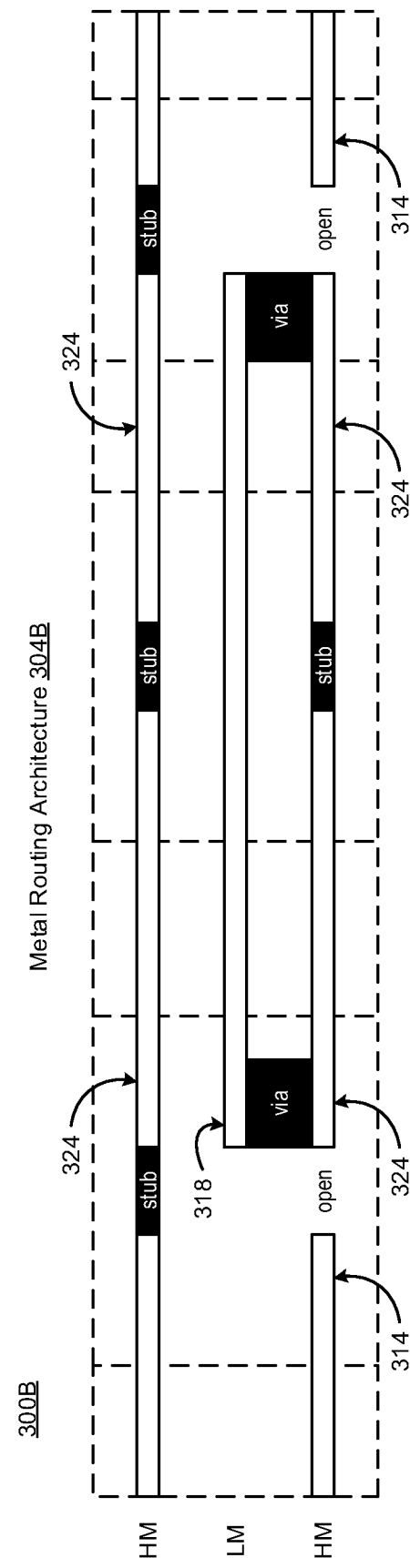

FIGS. 3A-3B illustrate diagrams of metal routing architecture in accordance with various implementations described herein. In particular, FIG. 3A illustrates a diagram 300A of metal routing architecture 304A, and FIG. 3B illustrates a diagram 300B of metal routing architecture 304B. The metal routing architectures 304A, 304B provide for flexible top-metal (or high metal) usage schemes and techniques for improving performance. For instance, as shown in FIGS. 3A-3B, the various metal routing schemes and techniques described herein may be used to extend higher metal lines and/or couple lower metal lines to the higher metal lines so as to thereby improve performance.

In various implementations, the metal routing architecture 304A, 304B shown in FIGS. 3A, 3B may be implemented as a system or a device having various integrated circuit (IC) components that are arranged and coupled together as an assemblage or combination of parts that provide for physical circuit designs and related structures. In some instances, a method of designing, providing and/or fabricating the metal routing architecture 304A, 304B in FIGS. 3A, 3B as an integrated system or device may involve use of the various IC circuit components described herein so as to thereby implement various circuit fabrication schemes and techniques associated therewith. Moreover, the metal routing architecture 304A, 304B may be integrated with computing circuitry and related components on a single chip, and the metal routing architecture 304A, 304B may be implemented and incorporated in embedded systems for automotive, electronic, mobile, server and IoT applications.

As shown in FIG. 3A, the metal routing architecture 304A may include multiple layers (LM, HM) that are arranged and vertically stacked in a multi-layered structure. In some implementations, the multiple layers (LM, HM) may include a lower layer (LM) and a higher layer (HM), wherein the lower layer (LM) may be referred to as a bottom layer, and wherein the higher layer (HM) may be referred to as a top layer. The metal routing architecture 304A may include pre-routed metal lines 314 formed in the higher layer (HM) of the multi-layered structure, and also, the metal routing architecture 304A may include pre-routed metal lines 318 formed in the lower layer (LM) of the multi-layered structure. Also, in various instances, the metal routing architecture 304A may have gaps (open) in the pre-routed metal lines 314 of the higher layer (HM). Further, in some instances, as shown in FIG. 3B, the gaps (open) may be filled with conductive stubs (stub) so as to thereby modify the pre-routed metal lines 314 in the higher layer (HM) as a continuous metal line 324 having an extended length that is longer than the pre-routed metal lines 318 in the lower layer (LM).

In some implementations, in reference to FIG. 3B, the metal routing architecture 304B may be manufactured, or caused to be manufactured, as integrated circuitry along with the longer pre-routed metal lines 314 in the higher layer (HM) as the continuous metal line 324 with the extended length. Also, in various instances, the metal routing architecture 304B may be manufactured, or caused to be manufactured, as integrated circuitry along with the shorter pre-routed metal line 218 that is coupled to the longer pre-routed metal line 214 with the conductive vias (via) that extend between the lower metal layer (LM) and the higher metal layer (HM). Also, the metal lines 314, 318 in the multiple layers (LM, HM) of the multi-layered structure may refer to shorter metal lines 318 in the lower layer (LM) of the multiple layers and to longer metal lines 314 in the higher layer (HM) of the multiple layers. Also, in some instances, the gaps (open) in the longer metal lines 314 of the higher layer (HM) may be filled with conductive stubs (stub) so as to modify the longer metal lines 314 in the higher layer (HM) as the continuous metal line 324 with an extended length. Also, the shorter metal line 318 in the lower layer (LM) may be coupled to the longer metal line 324 with conductive vias (via) that extend between the lower layer (LM) and the higher layer (HM).

In various implementations, the metal lines 314, 318 may refer to pre-routed metal lines, wherein the shorter metal line 318 refers to a shorter pre-routed metal line, and wherein the longer metal line 318 refers to a longer pre-routed metal line. Also, in various instances, the longer metal line 314 may have a longer length that is greater than a shorter length of the shorter metal line 318. Also, the gaps (open) may be filled with conductive stubs (stub), which refers to extending the longer pre-routed metal line 314 in the higher layer (HM) as the continuous metal line 324 with the extended length such that a length of the longer pre-routed metal line 314 of the higher layer (HM) is greater than a length of the shorter pre-routed metal line 318 in the lower layer (LM). Further, the gaps (open) in the longer pre-routed metal line 314 of the higher layer (HM) may refer to spatial openings that are formed between portions of the longer pre-routed metal lines 314 of the higher layer (HM). Moreover, the stubs (stub) may refer to conductive branches that bridge the spatial openings that are formed between the portions of the longer pre-routed metal lines 314 of the higher layer (HM).

Figure 4:
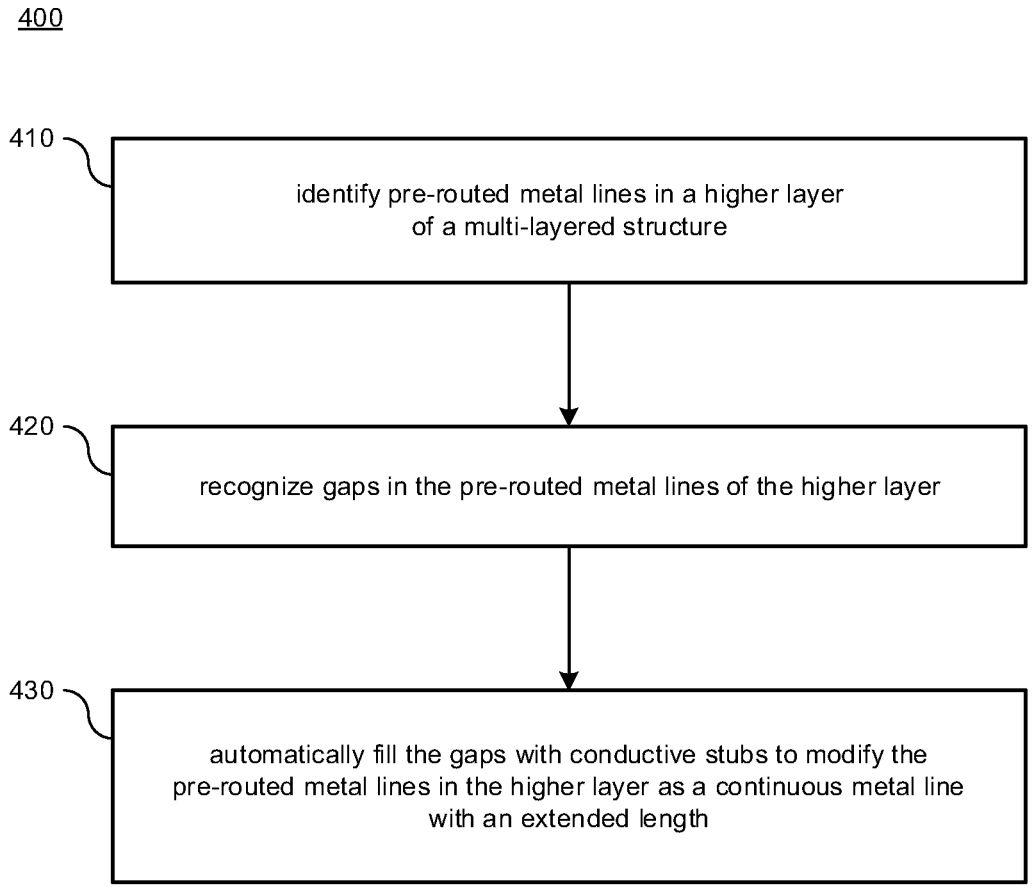

FIGS. 4-6 illustrate diagrams of methods for providing metal routing architecture in accordance with implementations described herein. In particular, FIG. 4 shows a method 400 for extending higher metal lines in reference to FIGS. 1A-1B, FIG. 5 shows a method 500 for coupling lower metal lines to higher metal lines in reference to FIGS. 2A-2B, and also, FIG. 6 shows a method 600 for extending higher metal lines and coupling lower/higher metal lines in reference to FIGS. 3A-3B. The various methods 400, 500, 600 for providing metal routing architectures may be used to implement flexible top-metal (or high metal) usage schemes and techniques for improving performance. In larger multi-bank memory instances (e.g., FB=4), stub programming may be applied and used to provide longer routes over larger distances to farther banks. Further, in smaller two-bank memory instances (e.g., FB=2), via programming may be applied and used to strap and improve resistance. In some instances, the methods in FIGS. 4-6 may be configured to program metal stacks in the higher layer so as to perform various different functions based on different memory configurations, wherein stub programming may be applied and used to provide longer routes over larger distances to farther banks in larger multi-bank memory configurations, and wherein via programming may also be applied and used to strap the pre-routed metal lines and improve resistance in smaller multi-bank memory configurations.

FIG. 4 illustrates a process diagram of a method 400 for providing metal routing architecture in accordance with implementations described herein.

It should be understood that even though method 400 indicates a particular order of operation execution, in some cases, various portions of operations may be executed in a different order, and on different systems. In other cases, additional operations and/or steps may be added to and/or omitted from method 400. Also, method 400 may be implemented in hardware and/or software. If implemented in hardware, method 400 may be implemented with components and/or circuitry, as described in reference to FIGS. 1A-1B. If implemented in software, method 400 may be implemented as a program or software instruction process configured for providing metal routing architecture, as described herein. Also, if implemented in software, instructions related to implementing the method 400 may be stored in memory and/or a database. For instance, a computer or some other type of computing device having a processor and memory may be configured to perform method 400.

As described in reference to FIG. 4, the method 400 may be used for fabricating and/or manufacturing, or causing to be fabricated and/or manufactured, an integrated circuit (IC) that implements the various metal routing schemes and techniques in physical design as described herein for providing metal routing architecture using various associated devices, components and/or circuitry described herein.

At block 410, method 400 may identify pre-routed metal lines in a higher layer of a multi-layered structure. At block 420, method 400 may recognize gaps in the pre-routed metal lines of the higher layer. At block 430, method 400 may automatically fill the gaps with conductive stubs to modify the pre-routed metal lines in the higher layer as a continuous metal line with an extended length. Moreover, method 400 may manufacture, or cause to be manufactured, integrated circuitry with the pre-routed metal lines in the higher layer as the continuous metal line with the extended length.

In various implementations, the multi-layered structure may include multiple layers including, e.g., the higher layer and a lower layer that is disposed beneath the higher layer, and also, the multiple layers may be arranged in a stack configuration with the higher layer disposed above the lower layer. Also, method 400 may be configured to identify pre-routed metal lines in the lower layer of the multi-layered structure, and the lower layer may have the pre-routed metal lines with a length that is less than a length of the pre-routed metal lines of the higher layer. In some instances, automatically filling the gaps with conductive stubs may refer to extending the pre-routed metal lines in the higher layer as the continuous metal line with the extended length such that the length of the pre-routed metal lines of the higher layer is greater than the length of the pre-routed metal lines in the lower layer.

In some implementations, the gaps in the pre-routed metal lines of the higher layer may refer to spatial openings that are formed between portions of the pre-routed metal lines of the higher layer, and the stubs may refer to conductive branches that bridge the spatial openings that are formed between the portions of the pre-routed metal lines of the higher layer. Also, the continuous metal lines formed by modifying the pre-routed metal lines in the higher layer may be used to achieve longer lengths of conductive metal lines for improved transmission of critical signals between circuit components in a power grid network.

FIG. 5 illustrates a process diagram of a method 500 for providing metal routing architecture in accordance with implementations described herein.

It should be understood that even though method 500 indicates a particular order of operation execution, in some cases, various portions of operations may be executed in a different order, and on different systems. In other cases, additional operations and/or steps may be added to and/or omitted from method 500. Also, method 500 may be implemented in hardware and/or software. If implemented in hardware, method 500 may be implemented with components and/or circuitry, as described in reference to FIGS. 2A-2B. If implemented in software, method 500 may be implemented as a program or software instruction process configured for providing metal routing architecture, as described herein. Also, if implemented in software, instructions related to implementing the method 500 may be stored in memory and/or a database. For instance, a computer or some other type of computing device having a processor and memory may be configured to perform method 500.

As described in reference to FIG. 5, the method 500 may be used for fabricating and/or manufacturing, or causing to be fabricated and/or manufactured, an integrated circuit (IC) that implements the various metal routing schemes and techniques in physical design as described herein for providing metal routing architecture using various associated devices, components and/or circuitry described herein.

At block 510, method 500 may identify pre-routed metal lines in layers of a multi-layered structure. At block 520, method 500 may recognize a first pre-routed metal line in a first layer of the layers. At block 530, method 500 may recognize a second pre-routed metal line in a second layer of the layers. At block 540, method 500 may automatically coupling the first pre-routed metal line to the second pre-routed metal line with conductive vias that extend between the first layer and the second layer. Also, method 400 may manufacture, or cause to be manufactured, integrated circuitry having the first pre-routed metal line coupled to the second pre-routed metal line with the conductive via that extends between the first layer and the second layer.

In various implementations, method 500 may recognize gaps in the second pre-routed metal line of the second layer, and also, method 500 may automatically fill the gaps with conductive stubs to modify the second pre-routed metal lines in the second layer as a continuous metal line with an extended length. Also, the first layer may refer to a lower layer that is disposed underneath the second layer, the second layer refers to a higher layer that is different than the first layer, and the layers are arranged in a stack configuration with the higher layer disposed above the lower layer.

In various implementations, method 500 may identify the first pre-routed metal line in the lower layer, and the lower layer has the first pre-routed metal line with a length that is less than a length of the second pre-routed metal line of the higher layer. Also, automatically filling the gaps with conductive stubs may refer to extending the second pre-routed metal line in the higher layer as the continuous metal line with the extended length such that the length of the pre-routed metal lines of the higher layer is greater than the length of the pre-routed metal lines in the lower layer. Also, the gaps in the second pre-routed metal line of the higher layer are associated with spatial openings that are formed between portions of the second pre-routed metal line of the higher layer, and the stubs may refer to conductive branches that bridge the spatial openings that are formed between the portions of the second pre-routed metal line of the higher layer.

FIG. 6 illustrates a process diagram of a method 600 for providing metal routing architecture in accordance with implementations described herein.

It should be understood that even though method 600 indicates a particular order of operation execution, in some cases, various portions of operations may be executed in a different order, and on different systems. In other cases, additional operations and/or steps may be added to and/or omitted from method 600. Also, method 600 may be implemented in hardware and/or software. If implemented in hardware, method 600 may be implemented with components and/or circuitry, as described in reference to FIGS. 3A-3B. If implemented in software, method 600 may be implemented as a program or software instruction process configured for providing metal routing architecture, as described herein. Also, if implemented in software, instructions related to implementing the method 600 may be stored in memory and/or a database. For instance, a computer or some other type of computing device having a processor and memory may be configured to perform method 600.

As described in reference to FIG. 6, the method 600 may be used for fabricating and/or manufacturing, or causing to be fabricated and/or manufactured, an integrated circuit (IC) that implements the various metal routing schemes and techniques in physical design as described herein for providing metal routing architecture using various associated devices, components and/or circuitry described herein.

At block 610, method 600 may identify metal lines in multiple layers of a multi-layered structure. At block 620, method 600 may recognize a shorter metal line in a lower layer of the multiple layers. At block 630, method 600 may recognize a longer metal line in a higher layer of the multiple layers. At block 640, method 600 may recognize gaps in the longer metal lines of the higher layer. At block 650, method 600 may automatically fill the gaps with conductive stubs to modify the longer metal lines in the higher layer as a continuous metal line with an extended length. Also, at block 660, method 600 may automatically couple the shorter metal line to the longer pre-routed metal line with conductive vias that extend between the lower layer and the higher layer.

Moreover, method 600 may manufacture, or cause to be manufactured, integrated circuitry with the longer pre-routed metal line in the higher layer as the continuous metal line with the extended length. Also, method 600 may manufacture, or cause to be manufactured, integrated circuitry having the shorter pre-routed metal line coupled to the longer pre-routed metal line with the conductive via that extends between the lower layer and the higher layer.

The metal lines may refer to pre-routed metal lines, the shorter metal line may refer to a shorter pre-routed metal line, the longer metal line may refer to a longer pre-routed metal line, and the longer metal line may have a longer length that is greater than a shorter length of the shorter metal line. Also, automatically filling the gaps with conductive stubs may refer to extending the longer pre-routed metal line in the higher layer as the continuous metal line with the extended length such that the length of the longer pre-routed metal line of the higher layer is greater than the length of the shorter pre-routed metal line in the lower layer. Further, the gaps in the longer pre-routed metal line of the higher layer may refer to spatial openings that are formed between portions of the longer pre-routed metal line of the higher layer, and the stubs may refer to conductive branches that bridge the spatial openings that are formed between the portions of the longer pre-routed metal line of the higher layer.

Figure 7:
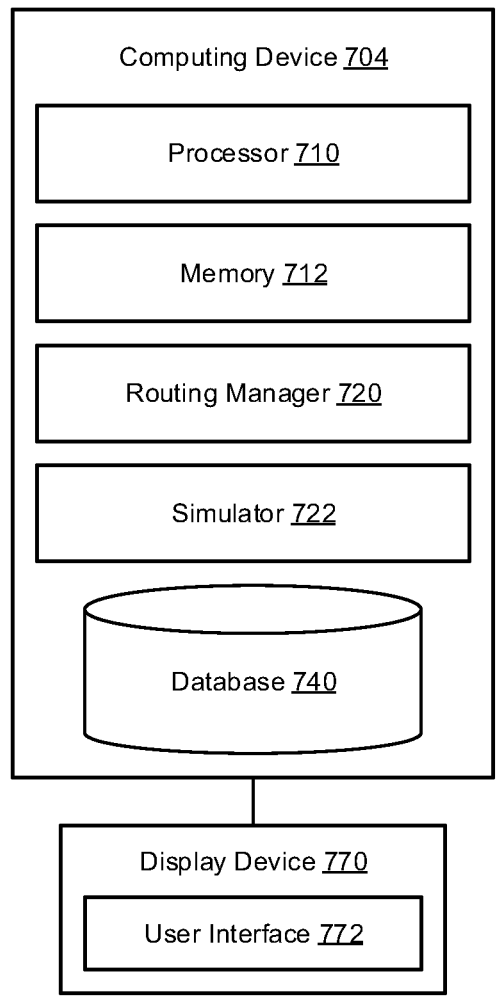
FIG. 7 illustrates a diagram of a system for providing metal routing architecture in physical design in accordance with various implementations described herein.

FIG. 7 illustrates a system 700 for providing metal routing architecture in physical design in accordance with various implementations described herein.

In reference to FIG. 7, the system 700 is associated with at least one computing device 704 that is implemented as a special purpose machine configured for implementing the metal routing schemes and techniques in physical design, as described herein. In various instances, the computing device 704 may have any standard element(s) and component(s), including at least one processor(s) 710, memory 712 (e.g., non-transitory computer-readable storage medium), one or more database(s) 740, power, peripherals, along with various other computing elements and/or components that may not be specifically shown in FIG. 7. The computing device 704 may include instructions recorded and/or stored on the non-transitory computer-readable medium 712 that are executable by the at least one processor 710. The computing device 704 may be associated with a display device 750 (e.g., a monitor or other display) that may be used to provide a user interface (UI) 752, such as, e.g., a graphical user interface (GUI). In various instances, the UI 752 may be used to receive parameters and/or preferences from a user for managing, operating, and controlling the computing device 704. Thus, in some instances, the computing device 704 may include the display device 750 for providing various output data and information to a user, and also, the display device 750 may include the UI 752 for receiving various input data and information from the user.

In reference to FIG. 7, the computing device 704 may include a routing manager 720 that may be configured to cause the at least one processor 710 to implement various metal routing schemes and techniques as described herein in reference to FIGS. 1A-6, including providing metal routing architecture related to implementing integrated circuitry in physical design. In some implementations, the routing manager 720 may be implemented in hardware and/or software. For instance, if implemented in software, the routing manager 720 may be stored in memory 712 or database 740. Also, in some instances, if implemented in hardware, the routing manager 720 may refer to a separate processing component that is configured to interface with the processor 710 and/or various other components.

In some instances, the routing manager 720 may be configured to cause the at least one processor 710 to perform various operations, as provided herein in reference to metal routing schemes and techniques described in FIGS. 1A-6. Also, in some instances, the memory 712 has stored thereon instructions that, when executed by the processor 710, cause the processor 710 to perform one or more or all of the following operations.

For instance, the routing manager 720 may be configured to cause the at least one processor 710 to perform various process related operations, such as, e.g., extending higher metal lines. The process related operations may include identifying pre-routed metal lines in a higher layer of a multi-layered structure and recognizing gaps in the pre-routed metal lines of the higher layer. The process related operations may include automatically filling the gaps with conductive stubs to modify the pre-routed metal lines in the higher layer as a continuous metal line with an extended length. Moreover, the process related operations may include manufacturing, or causing to be manufactured, integrated circuitry with the pre-routed metal lines in the higher layer as the continuous metal line with the extended length.

Also, in some instances, the routing manager 720 may be configured to cause the at least one processor 710 to perform various other process related operations, such as, e.g., coupling lower metal lines to higher metal lines. The process related operations may include identifying pre-routed metal lines in layers of a multi-layered structure and recognizing a first pre-routed metal line in a first layer of the layers. The process related operations may include recognizing a second pre-routed metal line in a second layer of the layers and automatically coupling the first pre-routed metal line to the second pre-routed metal line with conductive vias that extend between the first layer and the second layer. Moreover, the process related operations may include manufacturing, or causing to be manufactured, integrated circuitry having the first pre-routed metal line coupled to the second pre-routed metal line with the conductive via that extends between the first layer and the second layer.

Also, in some instances, the routing manager 720 may be configured to cause the at least one processor 710 to perform various other process related operations, such as, e.g., extending higher metal lines along with coupling lower/higher metal lines. For instance, the process related operations may include identifying metal lines in multiple layers of a multi-layered structure and recognizing a shorter metal line in a lower layer of the multiple layers. The process related operations may include recognizing a longer metal line in a higher layer of the multiple layers and recognizing gaps in the longer metal lines of the higher layer. Also, the process related operations may include automatically filling the gaps with conductive stubs to modify the longer metal lines in the higher layer as a continuous metal line with an extended length and automatically coupling the shorter metal line to the longer pre-routed metal line with conductive vias that extend between the lower layer and the higher layer. Moreover, the process related operations may also include manufacturing, or causing to be manufactured, integrated circuitry with the longer pre-routed metal line in the higher layer as the continuous metal line with the extended length.

In various implementations, in reference to larger memory instances, such as for larger multi-bank memory instances (e.g., FB=4), stub programming may be used to provide longer routes over larger distances to farther banks. In other implementations, in reference to other memory instances, such as for smaller 2-bank memory instances (e.g., FB=2), via-programming may be applied and used to strap and improve resistance.

In various implementations, methods in FIGS. 4-6 may be configured to program metal stacks in higher layers so as to perform various different functions based on different memory configurations. For instance, stub programming may be applied and used to provide longer routes over larger distances to farther banks in larger multi-bank memory instances, and/or related configurations. In other instances, via programming may also be applied and used to strap pre-routed metal lines in various layers to thereby improve resistance in smaller multi-bank memory configurations.

In accordance with the various implementations described herein in reference to FIGS. 1A-6, any one or more or all of process related operations performed by the routing manager 720 may be altered, modified, and/or changed so as to provide the various specific embodiments as shown in FIGS. 1A-6. Also, the metal routings may be formed in various structural semiconductor architecture of a logic block or module having a set of shapes with width and space definitions, and the logic block or module may comprise a physical structure associated with an integrated circuit that is included in a place-and-route (PNR) environment for electronic design automation (EDA) and/or software/hardware related thereto.

Further, in reference to FIG. 7, the computing device 704 may include a simulator 722 that is configured to cause the at least one processor 710 to simulate integrated circuitry and/or generate one or more simulations of integrated circuitry. In various implementations, the simulator 722 may be referred to as a simulating component, and also, the simulator 722 may be implemented in hardware and/or software. If implemented in software, the simulator 722 may be recorded or stored in memory 712 or database 740. If implemented in hardware, the simulator 720 may refer to a separate processing component configured to interface with the processor 710. In some instances, the simulator 722 may be a SPICE simulator that is configured to generate SPICE simulations of the integrated circuitry. Generally, SPICE is an acronym for Simulation Program with Integrated Circuit Emphasis, which is an open source analog electronic circuit simulator. SPICE may refer to a general-purpose software program used by the semiconductor industry to check the integrity of integrated circuit designs and to predict the behavior of integrated circuit designs. Thus, in some implementations, the routing manager 720 may be configured to interface with the simulator 722 so as to generate various timing data based on one or more or all simulations (including, e.g., SPICE simulations) of integrated circuitry that is utilized for analyzing performance characteristics of an integrated circuit including timing data of the integrated circuit. Also, the routing manager 720 may be configured to use one or more or all simulations (including, e.g., SPICE simulations) of the integrated circuit for evaluating operating behavior and conditions thereof.

In various implementations, the computing device 704 may include one or more databases 740 that are configured to store and/or record various data and information related to implementing metal routing schemes and techniques in physical design. Also, in some instances, the database(s) 740 may be configured to store and record data and information related to integrated circuitry, operating conditions, operating behaviors, timing data and any other related characteristics. Also, the database(s) 740 may be configured to store data and information associated with integrated circuitry and/or timing data in reference to simulation data (including, e.g., SPICE simulation data).

It should be intended that the claimed subject matter of the claims not be limited to the implementations and illustrations provided herein, but include modified forms of those implementations including portions of implementations and combinations of various elements of different implementations in accordance with the claims. It should be appreciated that in development of any such implementation, as in any engineering or design project, numerous implementation-specific decisions could be made to achieve developers' specific goals, such as compliance with system-related and business related constraints, which may vary in one implementation to another. It should be appreciated that such a development effort may be complex and time-consuming, but would nevertheless be a routine undertaking of design, fabrication, and manufacture for those of ordinary skill having benefit of this disclosure.

Described herein are implementations of a method for identify pre-routed metal lines in a higher layer of a multi-layered structure. The method may recognize gaps in the pre-routed metal lines of the higher layer, and also, the method may automatically fill the gaps with conductive stubs to modify the pre-routed metal lines in the higher layer as a continuous metal line with an extended length. Also, method may manufacture, or cause to be manufactured, integrated circuitry with the pre-routed metal lines in the higher layer as the continuous metal line with the extended length.

Described herein are implementations of a method for identifying pre-routed metal lines in layers of a multi-layered structure. The method may recognize a first pre-routed metal line in a first layer of the layers, and the method may recognize a second pre-routed metal line in a second layer of the layers. Also, the method may automatically couple the first pre-routed metal line to the second pre-routed metal line with conductive vias that extend between the first layer and the second layer.

Described herein are implementations of a method for identifying metal lines in multiple layers of a multi-layered structure. The method may recognize a shorter metal line in a lower layer of the multiple layers, and the method may recognize a longer metal line in a higher layer of the multiple layers. The method may recognize gaps in the longer metal lines of the higher layer. The method may automatically fill the gaps with conductive stubs to modify the longer metal lines in the higher layer as a continuous metal line with an extended length. The method may automatically couple the shorter metal line to the longer metal line with conductive vias that extend between the lower layer and the higher layer.

Reference has been made in detail to various implementations, examples of which are illustrated in the accompanying drawings and figures. In the above detailed description, numerous specific details are set forth to provide a thorough understanding of the disclosure provided herein. However, the present disclosure provided herein may be practiced without these specific details. In other instances, well-known methods, procedures, components, circuits and/or networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims may not be necessarily limited to the specific features or acts described above. Rather, specific features and acts described above are disclosed as example forms of implementing the subject matter of the claims that follow.

What is claimed is:

1. A method comprising:
    identifying pre-routed metal lines in layers of a multi-layered structure;
    recognizing a first pre-routed metal line in a lower layer of the layers;
    recognizing second pre-routed metal lines in a higher layer of the layers;
    recognizing a plurality of gaps in the second pre-routed metal lines in the higher layer;
    modifying the second pre-routed metal lines as at least one continuous metal line having an extended length that is greater than a length of the first pre-routed metal line, wherein modifying the second pre-routed metal lines comprises automatically filling the plurality of gaps with conductive stubs;
    and
    manufacturing, or causing to be manufactured, integrated circuitry with the second pre-routed metal lines in the higher layer as the at least one continuous metal line having the extended length.

2. The method of claim 1, further comprising:
    programming metal stacks in the higher layer to perform different functions based on different memory configurations,
    wherein stub programming is applied and used to provide longer routes over larger distances to farther banks in larger multi-bank memory configurations, and wherein via programming is applied and used to strap the pre-routed metal lines and improve resistance in smaller multi-bank memory configurations.

3. The method of claim 1, wherein:
the lower layer is disposed beneath the higher layer, and
the layers are arranged in a stack configuration with the higher layer disposed above the lower layer.

4. The method of claim 1, wherein identifying the pre-routed metal lines comprises:
identifying the first pre-routed metal line in the lower layer; and
identifying the second pre-routed metal lines in the higher layer.

5. The method of claim 1, wherein:
automatically filling the plurality of gaps with the conductive stubs refers to extending the second pre-routed metal lines in the higher layer as the at least one continuous metal line having the extended length.

6. The method of claim 1, wherein:
the plurality of gaps in the second pre-routed metal lines in the higher layer refer to spatial openings that are formed between portions of the second pre-routed metal lines in the higher layer, and
the conductive stubs refer to conductive branches that bridge the spatial openings that are formed between the portions of the second pre-routed metal lines in the higher layer.

7. The method of claim 1, wherein:
the at least one continuous metal line is used to achieve longer lengths of conductive metal lines for improved transmission of critical signals between circuit components in a power grid network.

8. A method comprising:
identifying pre-routed metal lines in layers of a multi-layered structure;
recognizing a first pre-routed metal line in a first layer of the layers;
recognizing a second pre-routed metal line in a second layer of the layers;
modifying the second pre-routed metal line as at least one continuous metal line having an extended length that is greater than a length of the first pre-routed metal line; and
automatically coupling the first pre-routed metal line to the second pre-routed metal line with conductive vias that extend between the first layer and the second layer.

9. The method of claim 8, further comprising:
manufacturing, or causing to be manufactured, integrated circuitry having the first pre-routed metal line coupled to the second pre-routed metal line with the conductive vias that extend between the first layer and the second layer.

10. The method of claim 8, wherein modifying the second pre-routed metal line comprises:
recognizing one or more gaps in the second pre-routed metal line in the second layer; and
automatically filling the one or more gaps with one or more conductive stubs to modify the second pre-routed metal line in the second layer as the at least one continuous metal line having the extended length.

11. The method of claim 10, wherein:
the first layer refers to a lower layer that is disposed underneath the second layer,
the second layer refers to a higher layer that is different than the first layer, and
the layers are arranged in a stack configuration with the higher layer disposed above the lower layer.

12. The method of claim 11, wherein identifying the pre-routed metal lines comprises:
identifying the first pre-routed metal line in the lower layer; and
identifying the second pre-routed metal line in the higher layer.

13. The method of claim 11, wherein:
automatically filling the one or more gaps with the one or more conductive stubs refers to extending the second pre-routed metal line in the higher layer as the at least one continuous metal line having the extended length.

14. The method of claim 11, wherein:
the one or more gaps in the second pre-routed metal line in the higher layer are associated with one or more spatial openings that are formed between portions of the second pre-routed metal line in the higher layer, and
the one or more conductive stubs refer to one or more conductive branches that bridge the one or more spatial openings that are formed between the portions of the second pre-routed metal line in the higher layer.

15. A method comprising:
identifying metal lines in multiple layers of a multi-layered structure;
recognizing a first metal line in a lower layer of the multiple layers;
recognizing second metal lines in a higher layer of the multiple layers;
recognizing gaps in the second metal lines in the higher layer;
modifying the second metal lines as at least one continuous metal line having an extended length that is greater than a length of the first metal line, wherein modifying the second metal lines comprises automatically filling the gaps with conductive stubs; and
automatically coupling the first metal line to the at least one continuous metal line with conductive vias that extend between the lower layer and the higher layer.

16. The method of claim 15, wherein:
the metal lines refer to pre-routed metal lines,
the first metal line refers to a first pre-routed metal line, and
the second metal lines refer to second pre-routed metal lines.

17. The method of claim 16, further comprising:
manufacturing, or causing to be manufactured, integrated circuitry with the second pre-routed metal lines in the higher layer as the at least one continuous metal line having the extended length.

18. The method of claim 16, further comprising:
manufacturing, or causing to be manufactured, integrated circuitry having the first pre-routed metal line coupled to the at least one continuous metal line with the conductive vias that extend between the lower layer and the higher layer.

19. The method of claim 16, wherein:
automatically filling the gaps with the conductive stubs refers to extending the second pre-routed metal lines in the higher layer as the at least one continuous metal line having the extended length.

20. The method of claim 16, wherein:
the gaps in the second pre-routed metal lines in the higher layer refer to spatial openings that are formed between portions of the second pre-routed metal lines in the higher layer, and the conductive stubs refer to conductive branches that bridge the spatial openings that are formed between the portions of the second pre-routed metal lines in the higher layer.

* * * * *